US009263665B1

(12) United States Patent
Tran et al.

(10) Patent No.: US 9,263,665 B1
(45) Date of Patent: Feb. 16, 2016

(54) TWO-BITS PER CELL STRUCTURE WITH SPIN TORQUE TRANSFER MAGNETIC RANDOM ACCESS MEMORY AND METHODS FOR FABRICATING THE SAME

(71) Applicant: GLOBALFOUNDRIES Singapore Pte. Ltd., Singapore (SG)

(72) Inventors: Xuan Anh Tran, Singapore (SG); Eng Huat Toh, Singapore (SG); Elgin Kiok Boone Quek, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/565,536

(22) Filed: Dec. 10, 2014

(51) Int. Cl.
*H01L 21/00* (2006.01)
*H01L 43/02* (2006.01)
*H01L 43/08* (2006.01)
*H01L 43/12* (2006.01)

(52) U.S. Cl.
CPC .............. *H01L 43/02* (2013.01); *H01L 43/08* (2013.01); *H01L 43/12* (2013.01)

(58) Field of Classification Search
CPC ............. H01L 21/28194; H01L 21/3212; H01L 21/3015; H01L 21/0274; H01L 21/043; H01L 21/308; H01L 21/475; H01L 21/8239; H01L 21/762; H01L 21/28079; H01L 21/02175
USPC ............. 438/3, 104, 106, 197, 225, 238, 240, 438/270, 700, 680, 692, 712, 487, 551, 553, 438/626, 772, 942; 257/E21.006, E2.007, 257/E21.023, E21.045, E21.084, E21.17, 257/E21.218, E21.267, E21.304, E21.435, 257/E21.545, E21.547, E21.645, E21.646
See application file for complete search history.

(56) References Cited

U.S. PATENT DOCUMENTS

| | | | | |
|---|---|---|---|---|
| 8,199,443 B2* | 6/2012 | Ito | ................... | B82Y 25/00 360/313 |
| 8,493,777 B2* | 7/2013 | Ranjan | ................... | B82Y 10/00 365/148 |
| 8,841,739 B2* | 9/2014 | Khalili Amiri | .......... | H01L 43/08 257/421 |
| 9,019,758 B2* | 4/2015 | Huai | ..................... | G11C 11/16 365/158 |
| 9,066,661 B2* | 6/2015 | Giddings | ................. | G01B 7/24 |
| 9,093,139 B2* | 7/2015 | Roiz Wilson | .......... | G11C 11/15 |

OTHER PUBLICATIONS

Lee et al. "Highly Scalable STT-MRAM with 3-Dimensional Cell Structure using in-plane Magnetic Anisotropy Materials", Symposium on VLSI Technology Digest of Technical Papers, 2012, pp. 65-66.

Wang et al., "Impact of Stray Field on the Switching Properties of Perpendicular MTJ for Scaled MRAM", Electronics and Optoelectronics Research Laboratories (EOL), 2012, pp. 29.2.1-29.2.4.

* cited by examiner

*Primary Examiner* — David Nhu
(74) *Attorney, Agent, or Firm* — Ingrassia Fisher & Lorenz, P.C.

(57) ABSTRACT

A method of fabricating a vertical two-bits per cell STT MRAM for high density storage includes forming a bottom electrode within an interlayer dielectric (ILD) layer, forming an anti-ferromagnetic (AF) layer over the bottom electrode, and forming a fixed layer along sidewalls of the AF layer. The method further includes forming a tunnel layer along the fixed layer, forming a free layer along the tunnel layer, and forming a top electrode along the free layer and over an upper surface of the AF layer.

18 Claims, 6 Drawing Sheets

TWO-BITS PER CELL STRUCTURE WITH SPIN TORQUE TRANSFER MAGNETIC RANDOM ACCESS MEMORY AND METHODS FOR FABRICATING THE SAME

TECHNICAL FIELD

The present disclosure generally relates to integrated circuits and methods for fabricating integrated circuits. More particularly, the present disclosure relates to spin torque transfer magnetic random access memory (STT-MRAM) structures in integrated circuits and methods for fabricating the same.

BACKGROUND

Magnetic Random Access Memory (MRAM) is a non-volatile computer memory technology based on magnetoresistance. MRAM differs from volatile Random Access Memory (RAM) in several respects. Because MRAM is non-volatile, MRAM can maintain memory content when the memory device is not powered. Though non-volatile RAM is typically slower than volatile RAM, MRAM has read and write response times that are comparable to that of volatile RAM. Unlike typical RAM technologies that store data as electric charges, MRAM data is stored by magnetoresistive elements. Generally, the magnetoresistive elements are made from two magnetic layers, each of which holds a magnetization. The magnetization of one layer (the "pinned layer") is fixed in its magnetic orientation, and the magnetization of the other layer (the "free layer") can be changed by an external magnetic field generated by a programming current. Thus, the magnetic field of the programming current can cause the magnetic orientations of the two magnetic layers to be either parallel, giving a lower electrical resistance across the layers ("0" state), or antiparallel, giving a higher electrical resistance across the layers ("1" state). The switching of the magnetic orientation of the free layer and the resulting high or low resistance states across the magnetic layers provide for the write and read operations of the typical MRAM cell.

Though MRAM technology offers non-volatility and faster response times, the MRAM cell is limited in scalability and susceptible to write disturbances. The programming current employed to switch between higher and lower electrical resistance states across the MRAM magnetic layers is typically high. Thus, when multiple cells are arranged in an MRAM array, the programming current directed to one memory cell may induce a field change in the free layer of an adjacent cell. This potential for write disturbances, also known as the "half-select problem," can be addressed using a spin torque transfer technique.

A conventional spin torque transfer MRAM (STT-MRAM) cell may include a magnetic cell stack, which may be a magnetic tunnel junction (MTJ) or a spin valve structure. An MTJ is a magnetoresistive data storing element including two magnetic layers (one pinned and one free) and an insulating layer in between the two magnetic layers; a bit line, a word line; a source line; and an access transistor. A spin valve structure has a structure similar to the MTJ, except a spin valve structure has a conductive layer in between the two magnetic layers. A programming current typically flows through the access transistor and the magnetic cell stack. The pinned layer polarizes the electron spin of the programming current, and torque is created as the spin-polarized current passes through the stack. The spin-polarized electron current interacts with the free layer by exerting a torque on the free layer. When the torque of the spin-polarized electron current passing through the stack is greater than the critical switching current density (JO, the torque exerted by the spin-polarized electron current is sufficient to switch the magnetization of the free layer. Thus, the magnetization of the free layer can be aligned to be either parallel or antiparallel to the pinned layer, and the resistance state across the stack is changed.

The STT-MRAM has advantageous characteristics over the MRAM, because the spin-polarized electron current eliminates the need for an external magnetic field to switch the free layer in the magnetoresistive elements. Further, scalability is improved as the programming current decreases with decreasing cell sizes, and the writing disturbance and half-select problem is addressed. Additionally, STT-MRAM technology allows for a higher tunnel magnetic resistance ratio, meaning there is a larger ratio between higher and lower electrical resistance states, thereby improving read operations in the magnetic domain.

Presently-known STT-MRAM structures and methods for fabricating such structures all suffer from several drawbacks. Structure of a standard 1T-1R STT-MRAM bit-cell could not achieve high density memory for stand-alone market; as such multi-bit per cells is preferred. For example, in some known structures, it has proven difficult to achieve compact design layouts, such as two bit per cell layouts, to afford higher density memory availability while maintaining a small footprint on the semiconductor device. These compact designs have heretofore required the use of complicated three-dimensional structures and a relatively high-operating current, which both adds to fabrication process complexity and power consumption.

Accordingly, with the increasing use of STT-MRAM in stand-alone memory application, it is desirable to provide robust and reliable STT-MRAM structures. Additionally, it is desirable to provide methods for the fabrication of such structures that are easily integrated into existing process flow schemes used in semiconductor fabrication facilities. Still further, it is desirable to provide such structures and methods that allow for the relatively compact two bit per cell architecture without the need for three-dimensional layouts or excessive power consumption. Furthermore, other desirable features and characteristics of the present disclosure will become apparent from the subsequent detailed description and the appended claims, taken in conjunction with the accompanying drawings and the foregoing technical field and background.

BRIEF SUMMARY

Spin torque transfer magnetic random access memory in integrated circuits and methods for fabricating the same are disclosed. In one exemplary embodiment, a method of fabricating a vertical sidewall STT-MRAM structure includes forming a bottom electrode within an interlayer dielectric (ILD) layer, forming an anti-ferromagnetic (AF) layer over the bottom electrode, and forming a fixed layer along sidewalls of the AF layer. The method further includes forming a tunnel layer along the fixed layer, forming a free layer along the tunnel layer, and forming a top electrode along the free layer and over an upper surface of the AF layer.

In another exemplary embodiment, a method of fabricating a vertical sidewall STT MRAM structure includes forming a bottom electrode within an ILD layer, extending the bottom electrode above the ILD layer, and forming a free layer along sidewalls of the bottom electrode. The method further includes forming a tunnel layer along the free layer, forming a fixed layer along the tunnel layer, and forming a top electrode along the fixed layer and over an upper surface of the bottom electrode.

In still a further embodiment, a vertical sidewall STT MRAM structure includes an ILD layer having a bottom electrode formed within the ILD layer, an anti-ferromagnetic (AF) layer centered over the bottom electrode, and a fixed layer disposed along vertically-oriented sidewalls of the AF layer. The integrated circuit structure further includes a tunnel layer disposed along the fixed layer, a free layer disposed along the tunnel layer, and a top electrode disposed along the free layer. A co-planar upper surface of the integrated circuit structure includes: an upper surface of vertically-oriented portions of tunnel layer; adjacent to said portions of the tunnel layer, an upper surface of vertically-oriented portions of the free layer; and adjacent to said portions of the free layer, an upper surface of vertically-oriented portions of the top electrode.

In still a further embodiment, vertical sidewall STT MRAM structure includes an integrated circuit structure includes an ILD layer having a bottom electrode formed within the ILD layer and extending vertically above the ILD layer, and a free layer disposed along vertically-oriented sidewalls of the bottom electrode. The integrated circuit structure further includes a tunnel layer disposed along the free layer, a fixed layer disposed along the tunnel layer, and a top electrode disposed along the fixed layer. A co-planar upper surface of the integrated circuit structure includes: an upper surface of vertically-oriented portions of tunnel layer; adjacent to said portions of the tunnel layer, an upper surface of vertically-oriented portions of the fixed layer; and adjacent to said portions of the fixed layer, an upper surface of vertically-oriented portions of the top electrode.

BRIEF DESCRIPTION OF THE DRAWINGS

The present disclosure will hereinafter be described in conjunction with the following drawing figures, wherein like numerals denote like elements, and wherein.

DETAILED DESCRIPTION

The following detailed description is merely illustrative in nature and is not intended to limit the embodiments of the subject matter or the application and uses of such embodiments. Furthermore, there is no intention to be bound by any expressed or implied theory presented in the preceding technical field, background, brief summary or the following detailed description.

Embodiments of the present disclosure are generally directed to spin torque transfer magnetic random access memory (STT-MRAM) integrated circuit structures and methods for fabricating the same. For the sake of brevity, conventional techniques related to integrated circuit device fabrication may not be described in detail herein. Moreover, the various tasks and process steps described herein may be incorporated into a more comprehensive procedure or process having additional steps or functionality not described in detail herein. In particular, various steps in the manufacture of semiconductor-based transistors are well-known and so, in the interest of brevity, many conventional steps will only be mentioned briefly herein or will be omitted entirely without providing the well-known process details.

Figure 1:
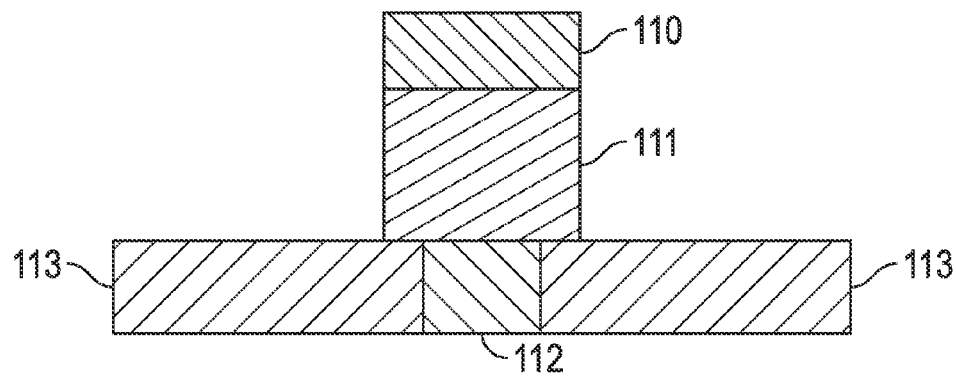
FIGS. 1-9 illustrate, in cross section, STT-MRAM structures and methods for fabricating STT-MRAM integrated circuits in accordance with one embodiment of the present disclosure.

FIGS. 1-9 illustrate, in cross section, STT-MRAM integrated circuit structures and methods for fabricating STT-MRAM integrated circuit structures in accordance with one embodiment of the present disclosure. The partially-formed integrated circuit structure illustrated in FIG. 1 includes an inter-layer dielectric (ILD) layer 113 and a metal layer 112 within the ILD layer 113. The metal layer 112 functions as a bottom electrode of the STT-MRAM structure to be formed. By the term "within," it is meant that the metal layer 112 is embedded in the ILD layer 113, a top surface of the bottom electrode 112 is substantially coplanar with a top surface of the ILD layer 113, and the bottom electrode 112 extends downward into the ILD layer 113, as illustrated in FIG. 1. The ILD layer 113 may be formed of one or more low-k dielectric materials, un-doped silicate glass (USG), silicon nitride, silicon oxynitride, or other commonly used materials. The dielectric constants (k value) of the low-k dielectric materials may be less than about 3.9, for example, less than about 2.8. The bottom electrode 112 may be formed of a conductive material, such as a metal or a metal alloy. In an embodiment, bottom electrode 112 is formed of tantalum. In one embodiment, the bottom electrode 112 is in physical and electrical connection with other metallization layers of the integrated circuit (not shown). The ILD layer 113 and the bottom electrode 112 may be formed through conventional techniques.

Though not illustrated for simplicity in FIGS. 1-8, the ILD layer 113 and the bottom electrode 112 may be formed over other ILD and/or metallization layers, and also over an active region of a semiconductor substrate forming part of the integrated circuit structure. As used herein, the term "semiconductor substrate" may include any semiconductor materials typically used in the formation of electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. The substrate may further include a plurality of isolation features (not shown), such as shallow trench isolation (STI) features or local oxidation of silicon (LOCOS) features. The isolation features may define and isolate the various microelectronic elements (not shown), also referred to herein as the aforesaid active regions. Examples of the various microelectronic elements that may be formed in the substrate include transistors (e.g., metal oxide semiconductor field effect transistors (MOSFET) and bipolar junction transistors (BJT)), and/or other suitable elements. This microelectronic element is used as selector decivie for STT-MRAM cell. Various processes are performed to form the various microelectronic elements including deposition, etching, implantation, photolithography, annealing, and/or other suitable processes. The microelectronic elements are interconnected to form the integrated circuit device, such as a logic device, memory device, radio frequency (RF) device, input/output (I/O) device, system-on-chip (SoC) device, combinations thereof, and/or other suitable types of devices.

As further illustrated in FIG. 1, two additional layers are deposited and patterned over the ILD 113/bottom electrode 112, including an anti-ferromagnetic (AF) layer 111 and a hardmask layer 110. The AF layer 111 may be formed of any material exhibiting anti-ferromagnetic properties, such as ruthenium, and may be formed on the basis of any suitable deposition process, such as chemical vapor deposition (CVD). AF coupling through Ru layer makes the structure stable in applied magnetic fields. The hardmask layer 110 may be formed of a silicon nitride material, for example. Subsequent to deposition of the respective materials, both the AF layer 111 and the hardmask layer 110 are formed by a suitable patterning and etching process, such as photolithographic patterning and etching. For example, a photoresist material layer (not separately illustrated) is deposited over the anti-ferromagnetic and hardmask material layers. The photoresist material layer is then patterned by exposure to a light source using conventional photolithographic processes. The patterning is performed so as to remove the photoresist material layer such that the only remaining photoresist material is disposed on an area that is centered over, but wider than, the bottom electrode 112. One or more etching steps are then performed to transfer the pattern to the anti-ferromagnetic material and the hardmask material, resulting in AF layer 111 and hardmask layer 110, which are centered over, but wider than, the bottom electrode 112. Both the AF layer 111 and the hardmask layer 110 have the same width, and as such the hardmask layer 110 covers an entirety of the upper surface of the AF layer 111, while an entirety, or at least substantially an entirety, of an upper surface of the hardmask layer 110 is exposed. Both of the AF layer 111 and the hardmask layer 110 generally have a rectangular cross section, and thus have sidewalls that extend vertically from the ILD layer 113, the sidewalls of the hardmask layer 110 being above the sidewalls of the AF layer 111. As a result of the one or more etching steps, the portion of the ILD layer 113 not covered by the AF layer 111 and the hardmask layer 110 is exposed. The remaining portions of the patterned photoresist layer are then removed (for example by a suitable polishing or planarization process), resulting substantially in the structure illustrated in FIG. 1.

Figure 2:
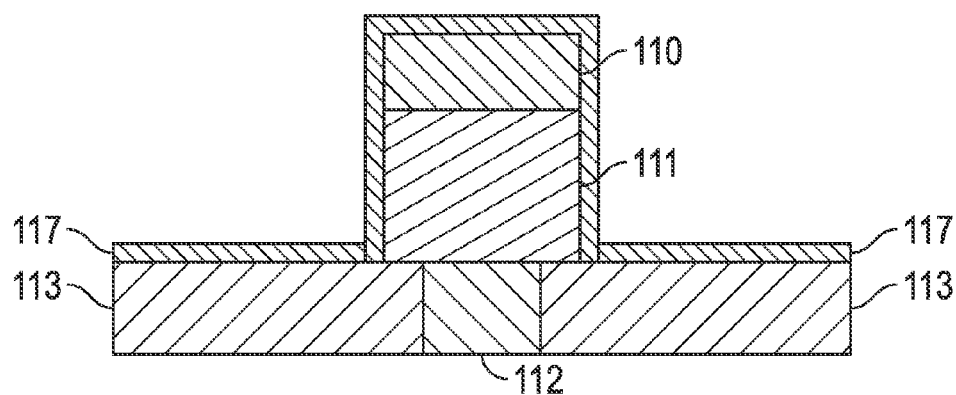

With reference now to FIG. 2, a "fixed" or "pinning" layer 117 of the STT-MRAM structure is conformally formed over the exposed portion of ILD layer 113, the sidewalls of AF layer 111, and the exposed upper surface and sidewalls of hardmask layer 110. In an exemplary embodiment, the fixed layer 117 is formed of a platinum manganese (PtMn), irridium manganese (IrMn), nickel managanese (NiMn), or iron manganese (FeMn) material. Accordingly, once deposited, the fixed layer 117 includes upper surfaces above the upper surface of hardmask layer 110 and ILD layer 113, as well as vertically-oriented (sidewall) surfaces that run parallel to the sidewalls of the AF layer 111 and the hardmask layer 110. With conformal deposition, the thickness of layer 117 may be substantially similar along its entire length, both on its upper surfaces and vertical surfaces.

Figure 3:
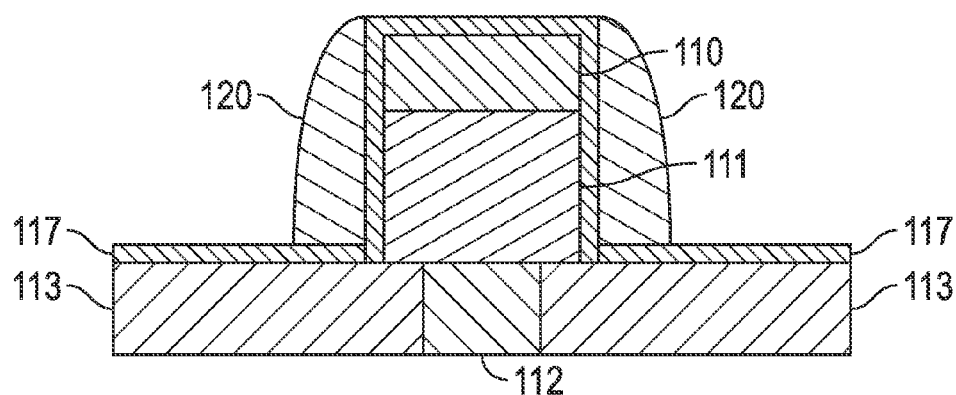

With reference now to FIG. 3, a spacer film 120 is formed over the structure with substantial coverage of the vertical sidewalls of the structure, namely along the vertically-oriented sidewall portions of the fixed layer 117. After the spacer film 120 has been formed, a directional (anisotropic) etch is used to remove material on horizontal surfaces, those being the upper surfaces of the fixed layer 117 disposed over the hardmask layer 110 and the ILD layer 113, thus leaving behind spacer structures 120 only on the sidewalls of fixed layer 117 as shown in FIG. 3. This can be accomplished, for example, with high substrate bias during RIE, or with highly directional IBE techniques. Due to the anisotropic nature of the etch, the spacer structures 120 will be wider at their base (lower portions of the vertically-oriented sidewalls of the fixed layer 117), and narrower at their top (nearer the upper surface of fixed layer 117, above the hardmask 110).

Figure 4:
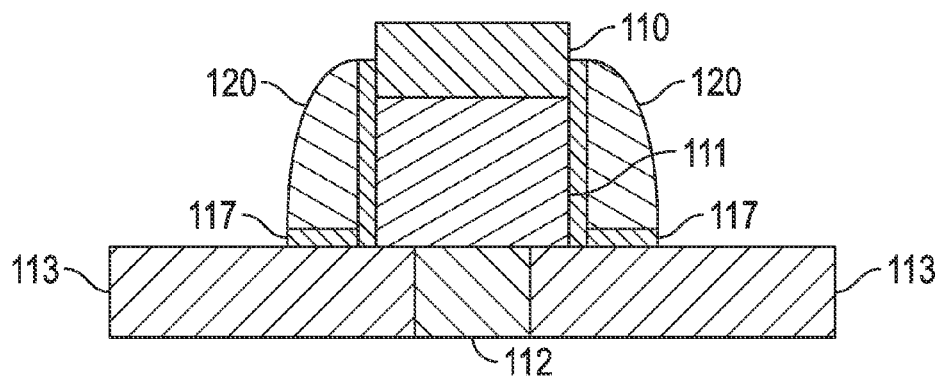
Figure 5:
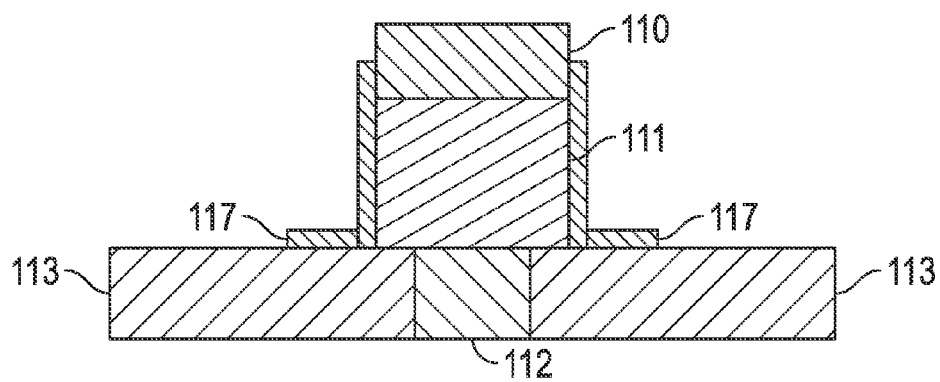

With reference now to FIG. 4, the exposed upper surfaces of the fixed layer 117 (above the hardmask layer 110 and above the ILD layer 113) are etched away, using an anisotropic etching process, such as RIE. This etch will also tend to remove a small amount of the uppermost portion of the vertically-oriented portion of the fixed layer 117, namely that portion along the upper sidewalls of the hardmask layer 110. Accordingly, subsequent to the etch, the uppermost portion of the sidewalls of the hardmask layer 110 become re-exposed, in addition to the upper surface of the hardmask 110 and the upper surface of the ILD layer 113. During this etch, the spacer structure is also etched, resulting in a spacer structure 120 of reduced size. Subsequent to the aforementioned etch, a further etching process is performed that is selective to the spacer material for a complete removal of the remaining (reduced-size) spacer structures 120, as illustrated in FIG. 5. Accordingly, what remains of the fixed layer 117 after removal of the spacer structure 120 thereover is the vertically-oriented portion covering the sidewalls of the AF layer 111 and the lower portion of the sidewalls of the hardmask layer 110, in addition to a small portion of the upper surface of the ILD layer 113 adjacent to the AF layer 111 that was underneath the "shadow" portion of the reduced-size spacer structure after etching of the fixed layer 117 (described above with regard to FIG. 4).

Figure 6:
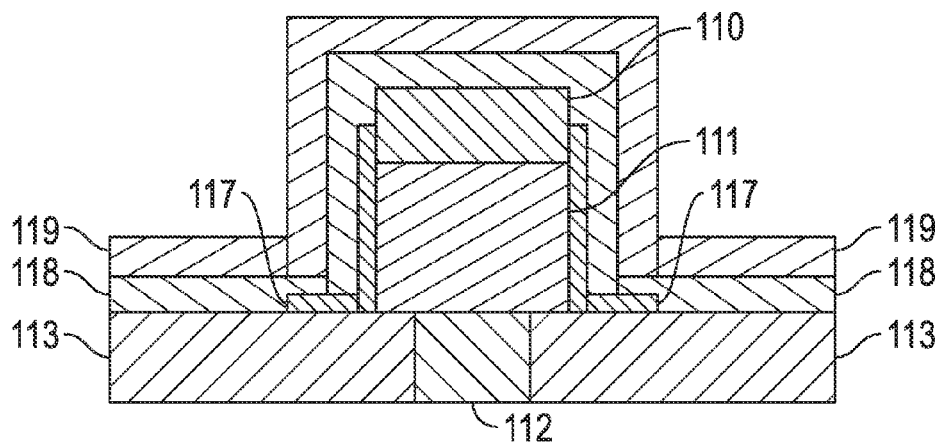
Figure 7:
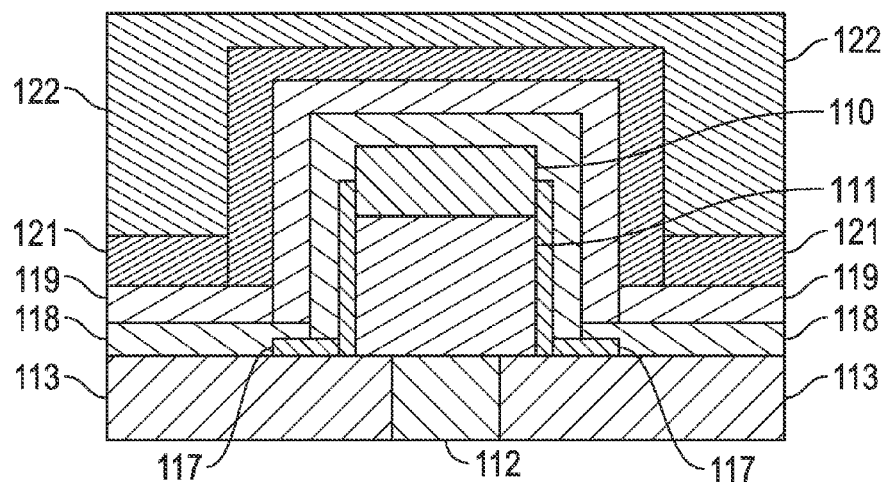

FIGS. 6 and 7 illustrate the formation of additional material layers over the above-described structure shown in FIG. 5, namely over the upper surface and upper sidewall portions of hardmask layer 110, over the remaining portions of the fixed layer 117, and over the exposed upper surface portions of the ILD layer 113. With reference to FIG. 6, these additional material layers include a tunnel layer 118 and a free layer 119, both of which are conformally formed using conventional deposition techniques, such as CVD, in the order stated. In an exemplary embodiment, the tunnel layer 118 is formed of MgO, and the free layer 119 is formed of CoFeB. As used herein, the term "formed of" means that the recited material is at least 50% of the formed layer. Other suitable materials for these well-understood layers are known to those having ordinary skill in the art. With reference to FIG. 7, top electrode 121 is formed of a conductive material, such as a metal or a metal alloy. In an embodiment, top electrode 121 is formed of tantalum, tantalum nitride, titanium, and/or other commonly used conductive metals. The formation of layer 121 may be conformal, using appropriate CVD techniques. Thereafter, a further ILD layer 122 is formed over top electrode 121 in regions 101 and 102. As with ILD 113, ILD layer 122 may be formed of one or more low-k dielectric materials, un-doped silicate glass (USG), silicon nitride, silicon oxynitride, or other commonly used materials. Accordingly, subsequent to the steps illustrated in FIGS. 6 and 7, four layers (118, 119, 121, and 122) are formed conformally over the structure described above with regard to FIG. 5. As a result and as shown in FIG. 7, each of these four layers include horizontally oriented portions that are disposed generally over the upper surface of ILD layer 113 and over the upper surface of the hardmask layer 110, as well as vertically-oriented portions disposed along the sidewalls of the AF layer 111 and the hardmask layer 110.

Figure 8:
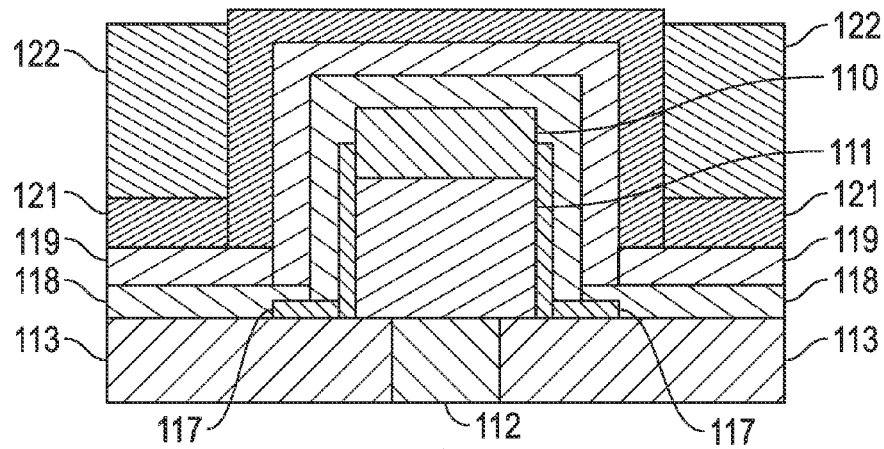
Figure 9:
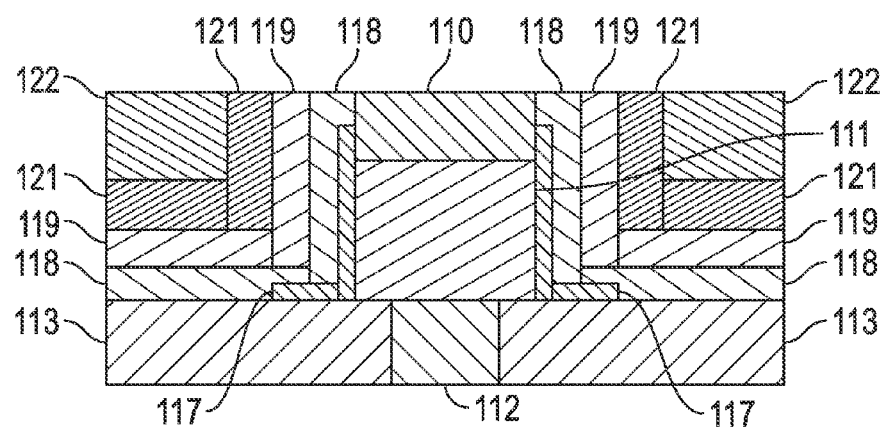
Figure 10:
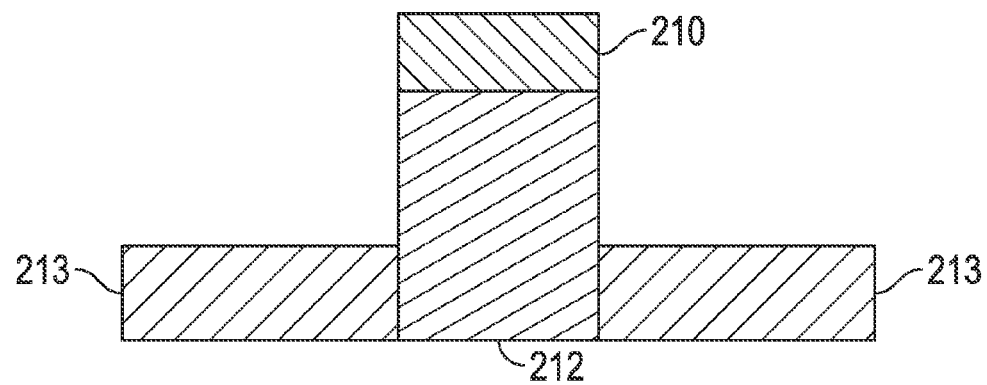
FIGS. 10-18 illustrate, in cross section, STT-MRAM structures and methods for fabricating STT-MRAM integrated circuits in accordance with another embodiment of the present disclosure.

FIGS. 8 and 9 illustrate alternative steps to complete the formation of the two-bits per cell vertical STT-MRAM structure in accordance with the presently-described embodiment. With reference first to FIG. 8, completion of the STT-MRAM structure to form a one bit per cell structure is disclosed. Here, an etching process is performed that is selective to the ILD material of layer 122. In this manner, an upper surface of the top electrode 121 is exposed, to which a suitable electrical contact structure may be formed. The ILD layer 122 remains in place along the sidewalls of the layer therebelow (top electrode 121), as well as above the upper surface of the ILD layer 113 (and of course the deposited layers 118, 119, and 121 thereabove). Accordingly, the structure shown in FIG. 8 includes the following: an ILD layer 113 having a bottom electrode 112 formed within the ILD layer 113, the ILD layer 113 and the bottom electrode 112 forming a planar surface; an AF layer 111 centered on the planar surface over the bottom electrode 112 and having a width that is greater than the bottom electrode 112; a hardmask layer 110 having a planar upper surface disposed over the AF layer 111 and having a width equal to that of the AF layer 111 such that the AF layer 111 and the hardmask layer 110 form continuous, vertically-oriented sidewalls extending above the planar surface of ILD layer 113; a fixed layer 117 disposed along the vertically-oriented sidewalls of the AF layer 111 and a lower portion of the vertically-oriented sidewalls of the hardmask 111; a tunnel layer 118 disposed over the upper surface of the hardmask layer 110, along the upper portion of the sidewalls of the hardmask layer 110, along the fixed layer 117, and along the upper surface of the ILD layer 113; a free layer 119 disposed over an entirety of the tunnel layer 118; a top electrode 121 disposed over an entirety of the free layer 119; and a further ILD layer 122 disposed only along vertically-oriented portions of the top electrode 121, leaving an upper surface portion of the top electrode 121 over the upper surface of the hardmask layer 110 exposed for contact with an electrical contact structure.

With reference now to FIG. 9, in an alternative embodiment, the STT-MRAM structure may be completed to form a two bit per cell structure, thereby affording a layout with higher density, but that does not require the increased power usage and complicated layout design of a three-dimensional structure. In contrast to the selective etching step described above in FIG. 8, a planarization step is used to planarize the structure to re-expose the upper surface of the hardmask layer 110. Suitable planarization techniques include chemical-mechanical planarization, as is well-known in the art. The planarization is performed so as to stop on the hardmask layer 110. The planarization thus results in the removal of the upper surface of the ILD layer 122, the upper surface of the top electrode 121, the upper surface of the free layer 119, and the upper surface of the tunnel layer 118. Thus, exposed along the planarized upper surface of the structure illustrated in FIG. 9 is the upper surface of the hardmask layer 110; adjacent to the hardmask layer 110, on both sides thereof, an upper surface of the vertically-oriented portions of tunnel layer 118; adjacent to said portions of the tunnel layer 118, on both sides thereof, an upper surface of the vertically-oriented portions of the free layer 119; adjacent to said portions of the free layer 119, on both sides thereof, an upper surface of the vertically-oriented portions of the top electrode 121; and further, adjacent to said portions of the top electrode 121, on both sides thereof, remaining portions of the ILD layer 122. Accordingly, the structure shown in FIG. 9 includes the following: an ILD layer 113 having a bottom electrode 112 formed within the ILD layer 113, the ILD layer 113 and the bottom electrode 112 forming a planar surface; an AF layer 111 centered on the planar surface over the bottom electrode 112 and having a width that is greater than the bottom electrode 112; a hardmask layer 110 having a planar upper surface disposed over the AF layer 111 and having a width equal to that of the AF layer 111 such that the AF layer 111 and the hardmask layer 110 form continuous, vertically-oriented sidewalls extending above the planar surface of ILD layer 113; a fixed layer 117 disposed along the vertically-oriented sidewalls of the AF layer 111 and a lower portion of the vertically-oriented sidewalls of the hardmask 111; a tunnel layer 118 disposed along the upper portion of the sidewalls of the hardmask layer 110, along the fixed layer 117, and along the upper surface of the ILD layer 113; a free layer 119 disposed along vertically-oriented portions of the tunnel layer 118; a top electrode 121 disposed along vertically-oriented portions of the free layer 119; and a further ILD layer 122 disposed only along vertically-oriented portions of the top electrode 121; such that co-planar with the upper surface of the hardmask layer 110 includes: adjacent to the hardmask layer 110, on both sides thereof, an upper surface of the vertically-oriented portions of tunnel layer 118; adjacent to said portions of the tunnel layer 118, on both sides thereof, an upper surface of the vertically-oriented portions of the free layer 119; adjacent to said portions of the free layer 119, on both sides thereof, an upper surface of the vertically-oriented portions of the top electrode 121; and further, adjacent to said portions of the top electrode 121, on both sides thereof, remaining portions of the ILD layer 122. The portions of the top electrode 121 that form a portion of the co-planar upper surface may form electrical contacts with suitable after-formed contact structures, thus resulting in a two bit per cell STT-MRAM structure that overcomes the deficiencies noted in STT-MRAM structures of the prior art.

Thereafter, the integrated circuit, whether formed according to FIG. 8 or FIG. 9, may be completed using known "middle-of-the-line" (MOL) processes and "back-end-of-the-line" (BEOL) processes, including for example the formation of metal contact structures to the STT-MRAM (namely the top electrode portion(s) 121) and the formation of further metallization layers over the STT-MRAM, among various other steps. The present disclosure is not intended to exclude any such further processes as are conventional in the fabrication of conventional integrated circuits and semiconductor chips.

FIGS. 10-18 illustrate, in cross section, high density 2 bit per cell memory based STT-MRAM and methods for fabricating vertical STT-MRAM memory in accordance with another embodiment of the present disclosure. In order to avoid duplication of description, only the differences between the embodiments shown in FIGS. 1-9 as compared to FIGS. 10-18 will be described. Further, reference numerals are incremented by 100 for like elements between embodiments for ease of understanding. Beginning with FIG. 10, the structure illustrated includes the ILD layer 213 and the hardmask layer 210 as described above with regard to FIG. 1. However, note that instead of the bottom electrode 212 being within and coplanar with the upper surface of the ILD layer 213, the bottom electrode 212 is formed so as to extend upward additionally to replace the AF layer 111. For example, the bottom electrode 212 within the ILD 213 may be formed as initially described above with regard to FIG. 1. Then, however, instead of depositing a layer of AF material followed by a layer of hardmask material, a layer of the same material as bottom electrode 212 is deposited (such as Ta, as noted above), follow by the hardmask material. In this manner, using the same patterning and etching steps as described above with regard to FIG. 1, a vertically "extended" bottom electrode 212 is formed, with the hardmask layer 210 on top thereof. As such, the bottom electrode 212 has sidewalls that extend above the ILD layer 213, its sidewalls being coplanar with the sidewalls of the hardmask layer 210, while still extending downward into the ILD layer for contact with a metallization layer therebelow (not illustrated).

Figure 11:
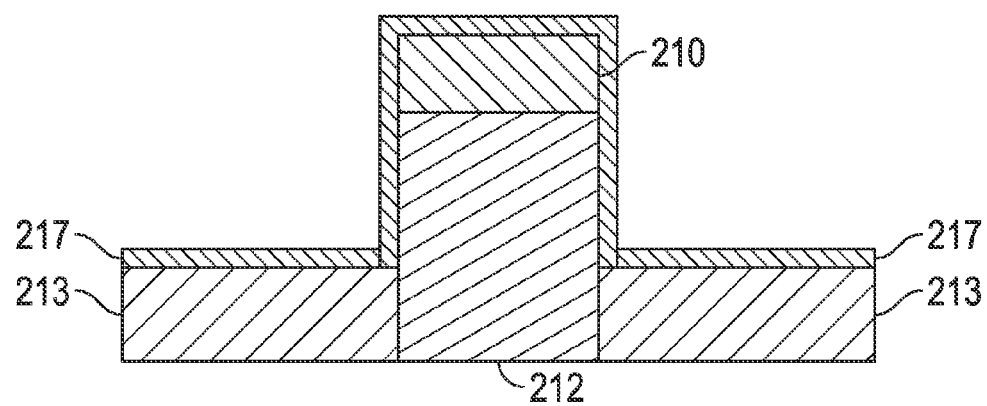
Figure 12:
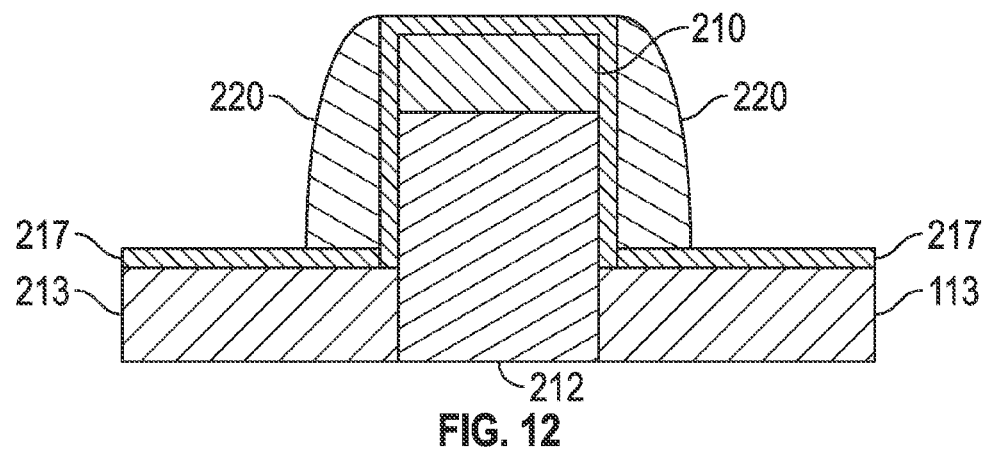
Figure 13:
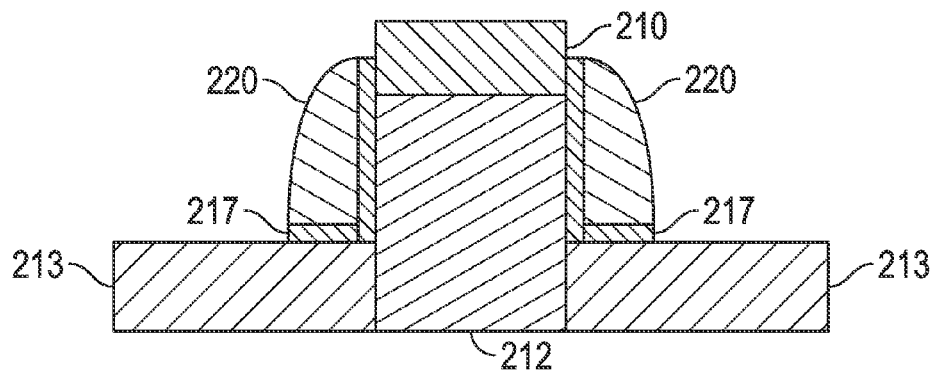
Figure 14:
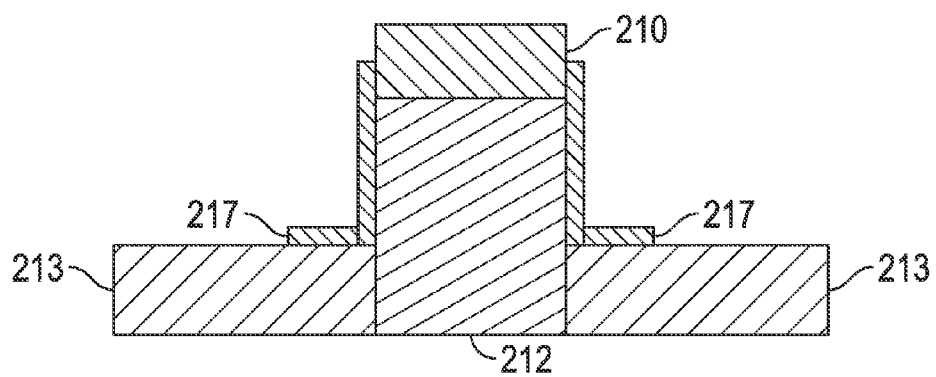
Figure 15:
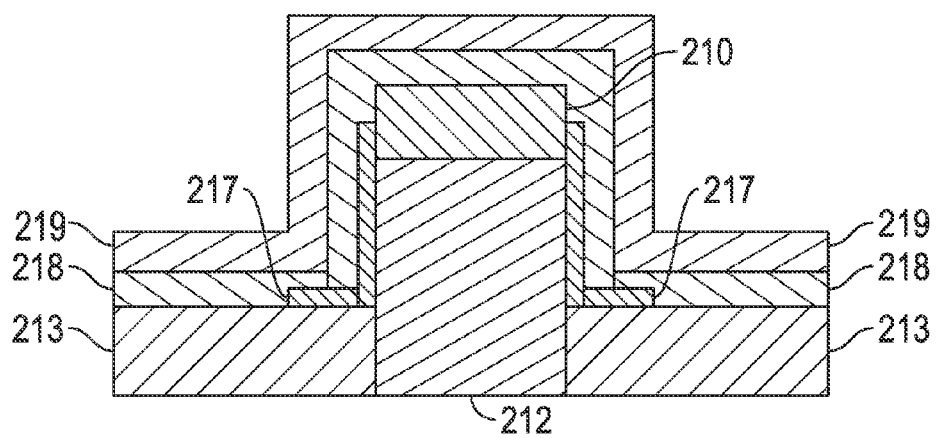
Figure 16:
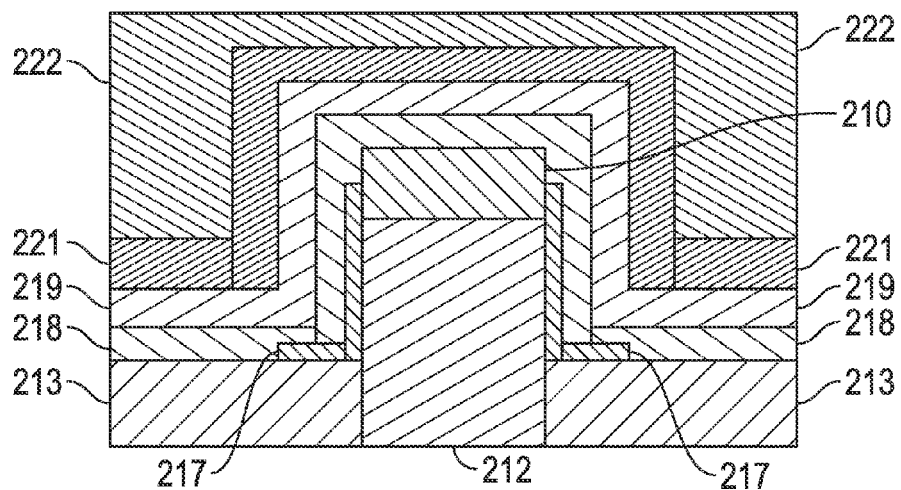

In FIG. 11 and those that follow, the positioning of the fixed layer 217 and the free layer 219 is reversed. Accordingly, the free layer 219 is formed as described above with regard to the fixed layer 117 in FIG. 2, except that its vertically-oriented portion is now disposed along the sidewalls of the bottom electrode 212, in addition to the sidewalls of the hardmask 210. The spacer 220 formation and etching, the free layer 219 etching, and the spacer removal proceed as described above with regard to FIGS. 3, 4, and 5, respectively, as shown in FIGS. 12, 13, and 14, respectively. Further, the deposition of the tunnel layer 218 and the fixed layer 217, and the top electrode 221 and the additional ILD layer 222, proceed as described above with regard to FIGS. 6 and 7, respectively as shown in FIGS. 15 and 16, respectively, again noting that the fixed layer 217 and the free layer 219 have their positions reversed with respect to the fixed layer 117 and the free layer 119 of the previous embodiment.

Figure 17:
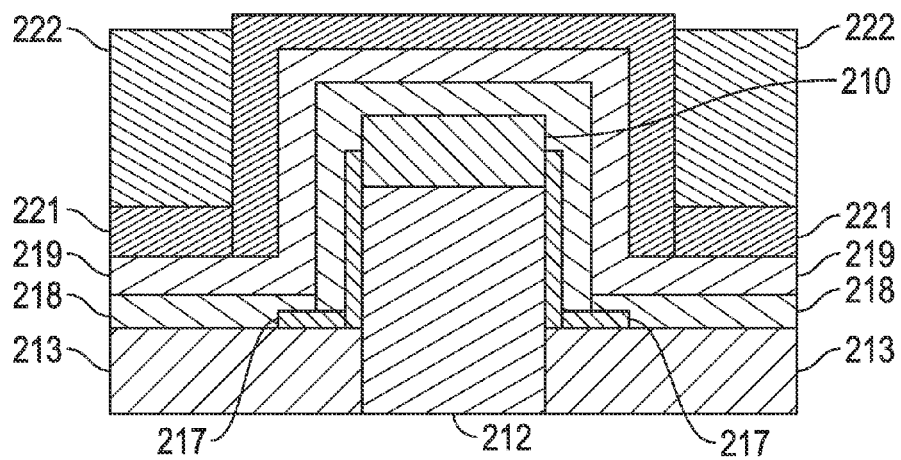
Figure 18:
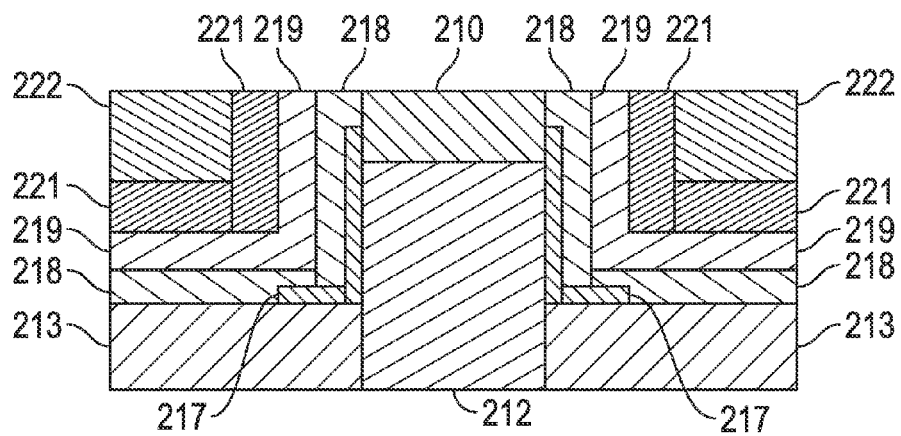

As such, the STT-MRAM structure of this embodiment may be completed according to either FIG. 17 for a one but per cell structure, or according to FIG. 18 for a two bit per cell structure. Namely, the etching of ILD layer 222 in FIG. 17, and the planarization to stop on the hardmask layer 210 in FIG. 18, are performed in substantially the same manner as the like steps described above with regard to FIGS. 8 and 9, respectively. Accordingly, the structure shown in FIG. 17 includes the following: an ILD layer 213 having a bottom electrode 212 formed within the ILD layer 213 and extending vertically above the ILD layer 213; a hardmask layer 210 having a planar upper surface disposed over the bottom electrode 212 and having a width equal to that of the bottom electrode 212 such that the bottom electrode 212 and the hardmask layer 210 form continuous, vertically-oriented sidewalls extending above the planar surface of ILD layer 213; a free layer 219 disposed along the vertically-oriented sidewalls of the bottom electrode 212 and a lower portion of the vertically-oriented sidewalls of the hardmask 210; a tunnel layer 218 disposed over the upper surface of the hardmask layer 210, along the upper portion of the sidewalls of the hardmask layer 210, along the free layer 219, and along the upper surface of the ILD layer 213; a fixed layer 217 disposed over an entirety of the tunnel layer 218; a top electrode 221 disposed over an entirety of the fixed layer 217; and a further ILD layer 222 disposed only along vertically-oriented portions of the top electrode 221, leaving an upper surface portion of the top electrode 221 over the upper surface of the hardmask layer 210 exposed for contact with an electrical contact structure.

Furthermore, the structure shown in FIG. 9 includes the following: an ILD layer 213 having a bottom electrode 212 formed within the ILD layer 213 and extending vertically above the ILD layer 213; a hardmask layer 210 having a planar upper surface disposed over the bottom electrode 212 and having a width equal to that of the bottom electrode 212 such that the bottom electrode 212 and the hardmask layer 210 form continuous, vertically-oriented sidewalls extending above the planar surface of ILD layer 213; a free layer 219 disposed along the vertically-oriented sidewalls of the bottom electrode 212 and a lower portion of the vertically-oriented sidewalls of the hardmask 210; a tunnel layer 218 disposed along the upper portion of the sidewalls of the hardmask layer 210, along the free layer 219, and along the upper surface of the ILD layer 213; a fixed layer 217 disposed along vertically-oriented portions of the tunnel layer 218; a top electrode 221 disposed along vertically-oriented portions of the fixed layer 217; and a further ILD layer 222 disposed only along vertically-oriented portions of the top electrode 221; such that co-planar with the upper surface of the hardmask layer 210 includes: adjacent to the hardmask layer 210, on both sides thereof, an upper surface of the vertically-oriented portions of tunnel layer 218; adjacent to said portions of the tunnel layer 218, on both sides thereof, an upper surface of the vertically-oriented portions of the fixed layer 217; adjacent to said portions of the fixed layer 217, on both sides thereof, an upper surface of the vertically-oriented portions of the top electrode 221; and further, adjacent to said portions of the top electrode 221, on both sides thereof, remaining portions of the ILD layer 222. The portions of the top electrode 221 that form a portion of the co-planar upper surface may form electrical contacts with suitable after-formed contact structures, thus resulting in a two bit per cell STT-MRAM structure that overcomes the deficiencies noted in STT-MRAM structures of the prior art.

As with the previously described embodiment, thereafter, the integrated circuit, whether formed according to FIG. 17 or FIG. 18, may be completed using known "middle-of-the-line" (MOL) processes and "back-end-of-the-line" (BEOL) processes, including for example the formation of metal contact structures to the STT-MRAM (namely the top electrode portion(s) 221) and the formation of further metallization layers over the STT-MRAM, among various other steps. The present disclosure is not intended to exclude any such further processes as are conventional in the fabrication of conventional integrated circuits and semiconductor chips.

Accordingly, novel STT-MRAM structures and methods for fabricating the same have been disclosed. The disclosed embodiments provide robust and reliable STT-MRAM structures. Additionally, the disclosed embodiments provide methods for the fabrication of such structures that are easily integrated into existing process flow schemes used in semiconductor fabrication facilities. Still further, the disclosed embodiments provide such structures and methods that do not suffer from the aforementioned drawbacks associated with high power usage and difficult three-dimensional layout designs to accommodate the two bit per cell architecture as are found in the prior art.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method of fabricating an integrated circuit comprising:
   forming a bottom electrode within an interlayer dielectric (ILD) layer, wherein the bottom electrode is formed having an upper surface coplanar with an upper surface of the ILD layer;
   forming an anti-ferromagnetic (AF) layer over the bottom electrode;
   forming a fixed layer along sidewalls of the AF layer;
   forming a tunnel layer along the fixed layer;
   forming a free layer along the tunnel layer; and
   forming a top electrode along the free layer and over an upper surface of the AF layer.

2. The method of claim 1, wherein forming the AF layer comprises forming a layer of a PtMn material.

3. The method of claim 1, further comprising forming a hardmask layer over the AF layer.

4. The method of claim 3, further comprising forming the fixed layer along a lower portion of sidewalls of the hardmask layer.

5. The method of claim 3, further comprising forming the tunnel layer along an upper portion of sidewalls of the hardmask layer and over an upper surface of the hardmask layer.

6. The method of claim 5, further comprising forming the free layer along an entirety of the tunnel layer.

7. The method of claim 1, further comprising removing the top electrode from over the upper surface of the AF layer.

8. The method of claim 1, further comprising forming an additional ILD layer over the top electrode.

9. A method of fabricating an integrated circuit comprising:
   forming a bottom electrode within an interlayer dielectric (ILD) layer;
   extending the bottom electrode above the ILD layer, wherein the bottom electrode is formed having vertically-oriented sidewalls that extend vertically from an upper surface of the ILD layer;
   forming a free layer along sidewalls of the bottom electrode;
   forming a tunnel layer along the free layer;
   forming a fixed layer along the tunnel layer; and
   forming a top electrode along the fixed layer and over an upper surface of the bottom electrode.

10. The method of claim 9, wherein forming the bottom electrode comprises forming a layer of a Ta material.

11. The method of claim 9, further comprising forming a hardmask layer over the bottom electrode.

12. The method of claim 11, further comprising forming the free layer along a lower portion of sidewalls of the hardmask layer.

13. The method of claim 11, further comprising forming the tunnel layer along an upper portion of sidewalls of the hardmask layer and over an upper surface of the hardmask layer.

14. The method of claim 13, further comprising forming the fixed layer along an entirety of the tunnel layer.

15. The method of claim 9, further comprising removing the top electrode from over the upper surface of the bottom electrode.

16. The method of claim 9, further comprising forming an additional ILD layer over the top electrode.

17. An integrated circuit structure comprising:
   an interlayer dielectric (ILD) layer having a bottom electrode formed within the ILD layer;
   an anti-ferromagnetic (AF) layer centered over the bottom electrode;
   a fixed layer disposed along vertically-oriented sidewalls of the AF layer;
   a tunnel layer disposed along the fixed layer;
   a free layer disposed along the tunnel layer; and
   a top electrode disposed along the free layer,
   wherein a co-planar upper surface of the integrated circuit structure comprises: an upper surface of vertically-oriented portions of tunnel layer; adjacent to said portions of the tunnel layer, an upper surface of vertically-oriented portions of the free layer; and adjacent to said portions of the free layer, an upper surface of vertically-oriented portions of the top electrode.

18. The integrated circuit structure of claim 17, further comprising an additional ILD layer disposed along the top electrode.

* * * * *